United States Patent [19]

Mitzlaff

[11] Patent Number: 5,757,229
[45] Date of Patent: May 26, 1998

[54] BIAS CIRCUIT FOR A POWER AMPLIFIER

[75] Inventor: James Edward Mitzlaff, Arlington Heights, Ill.

[73] Assignee: Motorola, Inc., Schaumburg, Ill.

[21] Appl. No.: 672,710

[22] Filed: Jun. 28, 1996

[51] Int. Cl.$^6$ ............................. H03F 3/68; H03G 3/20
[52] U.S. Cl. ...................... 330/124 R; 330/134; 330/136
[58] Field of Search ............................. 330/124 R, 127, 330/129, 134, 136; 455/127

[56] References Cited

U.S. PATENT DOCUMENTS

| | | | |
|---|---|---|---|
| 5,311,143 | 5/1994 | Soliday | 330/127 |
| 5,420,541 | 5/1995 | Upton et al. | 330/286 |
| 5,568,086 | 10/1996 | Schuss et al. | 330/124 R |

*Primary Examiner*—Steven Mottola

[57] ABSTRACT

A method for amplifying an RF input signal using a power amplifier (105, 107 or 205, 207) comprises the steps of dividing or quadrature splitting (103) the RF input signal into an in-phase signal and a quadrature phase signal. A carrier amplifier bias input (111, 211) signal is varied relative to the magnitude of the RF input signal. A peaking amplifier bias input (113, 213) signal is varied relative to the magnitude of the RF input signal. The in-phase signal is amplified using a carrier amplifier (105, 205) to produce a first amplified signal. The quadrature phase signal is amplified using a peaking amplifier (107, 207) to produce a second amplified signal. The first amplified signal and the second amplified signal are combined (115, 117), in phase, to produce an output signal.

9 Claims, 2 Drawing Sheets

BIAS CIRCUIT FOR A POWER AMPLIFIER

FIELD OF THE INVENTION

This invention relates to linear power amplifiers, including but not limited to biasing of Doherty-type amplifiers.

BACKGROUND OF THE INVENTION

It is desirable for radio frequency (RF) power amplifiers to linearly amplify RF signals in a highly efficient manner. Nevertheless, there are tradeoffs between maximum efficiency and high linearity. Efficiency is generally proportional to input drive level, and high efficiency is usually not attained until an amplifier approaches its maximum output power, which is not consistent with linear operation. Doherty-type amplifiers achieve an efficiency advantage over standard class AB and class B amplifiers below peak power, in part, because of an instantaneous modulation of their carrier amplifier's loadline as the RF input level changes. In other words, Doherty-type amplifiers exhibit a more benign relationship between input drive level and efficiency because the amplifier's loadline is continuously modified to maintain high efficiency as input drive level changes. In addition, the bias power of Doherty-type amplifiers is greatly reduced over standard class AB and class B amplifiers.

A method of biasing a Doherty-type amplifier is described in U.S. patent application No. 08/566,811, titled "LINEAR POWER AMPLIFIER USING ACTIVE BIAS FOR HIGH EFFICIENCY AND METHOD THEREFOR," filed on Dec. 4, 1995 on behalf of BERNARD E. SIGMON et al., with the same assignee as the present invention, which application is incorporated herein by reference. The circuit described in the above-referenced application relies on changes in the gate or base bias current of the carrier amplifier as a way to measure RF input power to that device. Such a mechanism is not effective for MOSFET (metal oxide semiconductor field effect transistor) amplifier devices, because such devices do not draw bias current at any RF drive level.

Accordingly, there is a need for a bias circuit for a Doherty-type amplifier that provides good biasing for MOSFET or other zero bias current amplifiers, but is efficient over the the dynamic RF input drive range.

DESCRIPTION OF THE PREFERRED EMBODIMENT

Figure 1:
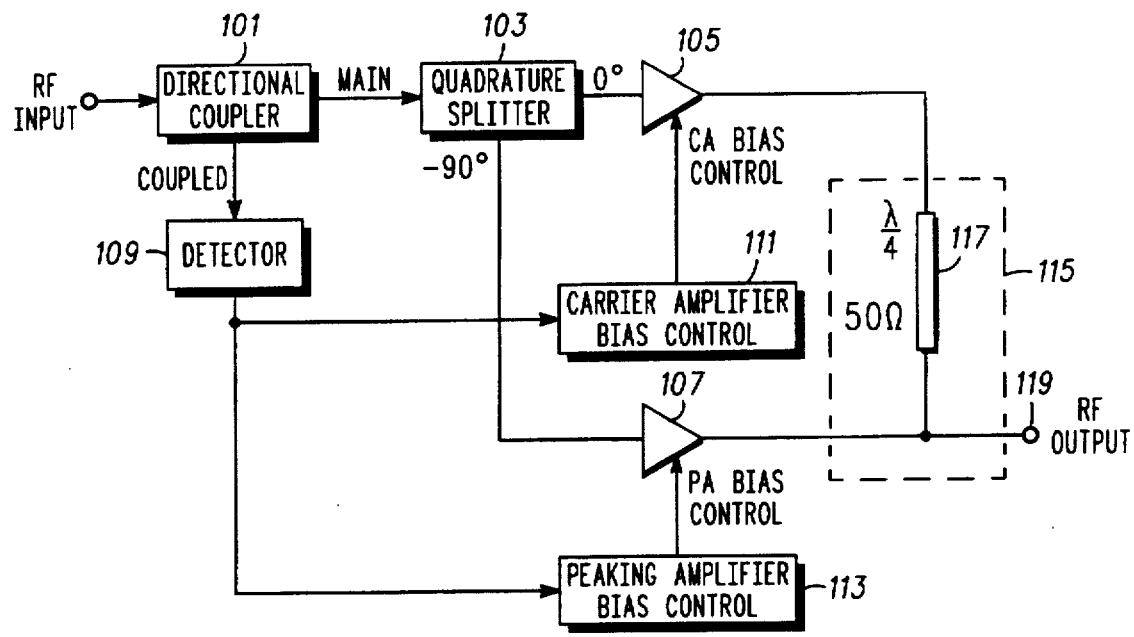
FIG. 1 is a block diagram of a Doherty-type power amplifier with bias control in accordance with the invention.

The following describes an apparatus for and method of bias control for a Doherty-type power amplifier. The Doherty power amplifier is comprised of a carrier amplifier and a peaking amplifier. Different bias signals are provided to the carrier amplifier and the peaking amplifier to provide constant power gain while limiting intermodulation distortion. In one embodiment, the carrier amplifier bias signal decreases as the peaking amplifier bias signal increases.

The present invention provides a power amplifier comprising a power divider coupled to an RF input signal for producing an in-phase signal and a quadrature phase signal from the RF input signal. A carrier amplifier amplifies the in-phase signal from the power divider and has a carrier amplifier bias input. A peaking amplifier amplifies the quadrature phase signal from the power divider and has a peaking amplifier bias input. A combiner is coupled to an output of the carrier amplifier and an output of the peaking amplifier. The combiner combines in additive phase the output of the carrier amplifier and the output of the peaking amplifier. A first bias circuit is coupled to the carrier amplifier, wherein the carrier amplifier bias input is provided by the first bias circuit and controlled by a first signal indicative of the magnitude of the RF input signal of the power amplifier. A second bias circuit is coupled to the peaking amplifier, wherein the peaking amplifier bias input is provided by the second bias circuit and controlled by a second signal indicative of the magnitude of the RF input signal of the power amplifier. Alternatively, the first signal and the second signal may be the same signal. In addition, the first signal and/or the second signal may be derived from an output of an envelope detector that is coupled to the RF input signal. Furthermore, the first signal and/or the second signal may be proportional to a current drawn by the carrier amplifier. Additionally, the carrier amplifier bias level may be decreased as the peaking amplifier bias level is increased.

A method for amplifying an RF input signal using a power amplifier comprises the steps of dividing the RF input signal into an in-phase signal and a quadrature phase signal. A carrier amplifier bias input signal is varied relative to the magnitude of the RF input signal. A peaking amplifier bias input signal is varied relative to the magnitude of the RF input signal. The in-phase signal is amplified using a carrier amplifier to produce a first amplified signal. The quadrature phase signal is amplified using a peaking amplifier to produce a second amplified signal. The first amplified signal and the second amplified signal are combined, in phase, to produce an output signal. Alternatively, the step of varying the carrier amplifier bias input signal and the step of varying the peaking amplifier bias input signal may be performed such that the carrier amplifier bias input signal decreases as the peaking amplifier bias input signal increases. Envelope detecting the RF input signal may be performed to derive the magnitude of the RF input signal. The magnitude of the RF input signal may be determined from a current drawn by the carrier amplifier.

A block diagram of a Doherty-type power amplifier with bias control is shown in FIG. 1. An RF input signal is fed into a directional coupler 101 that performs the function of providing a small sample of the input signal at its coupled output while delivering the majority of the input signal power to the main output. The main output of the directional coupler 101 is input to a quadrature splitter 103. Due to splitting, the in-phase signal and the quadrature phase signal are 3 dB less in magnitude than RF input signal.

The in-phase (0°) output of the quadrature splitter 103 is input to a carrier amplifier 105. The quadrature phase (minus 90°) output of the quadrature splitter 103 is input to a peaking amplifier 107. The coupled output of the directional coupler 101 is input to a detector 109. The detector may be a diode envelope detector such as described in Chapter 9 of the book Solid State Radio Engineering by Herbert L. Krauss et al., (John Wiley & Sons, New York, 1980).

The output of the detector 109 is an indication of the RF input power level of the RF input signal, as well as the magnitude of the RF input signal. The detector 109 may be set up to indicate either peak or average power. The output of the detector is input to a carrier amplifier bias control 111 and a peaking amplifier bias control 113 The output of the carrier amplifier bias control 111 is a CA bias control signal, which is input to the bias control input of the carrier amplifier 105. In the preferred embodiment, the carrier amplifier is biased slightly above cutoff when the detector 109 output indicates a low input signal level. This process allows the carrier amplifier to provide linear amplification at low input signal levels. The output of the peaking amplifier bias control 113 is a PA bias control signal, which is input to the bias control input signal of the peaking amplifier 107. In the preferred embodiment, the peaking amplifier is biased below cutoff when the detector 109 output indicates a low input signal level. This process improves efficiency at low input signal levels by preventing the peaking amplifier from drawing current until the RF input signal has reached about half of its maximum permitted amplitude.

The output of the carrier amplifier 105 and the output of the peaking amplifier 107 are input to a combiner 115. In the preferred embodiment, the combiner is composed of a quarter wave length ($\lambda/4$) 50 ohm transmission line 117, the output of which is connected to the peaking amplifier output at the RF output port 119. At low input signal levels, the peaking amplifier is inactive and presents a high impedance to the combiner 115 at the RF output port 119. In the preferred embodiment, the impedance at the RF output port is nominally 25 ohms, and the ($\lambda/4$) 50 ohm transmission line 117, transforms this impedance to 100 ohms at the output of the carrier amplifier. Because the carrier amplifier is designed to operate into a nominal 50 ohm load, presenting a 100 ohm load causes the carrier amplifier to saturate at half its nominal maximum output power level when the RF input signal reaches half of its maximum permitted amplitude. At this point, the amplitude of the RF input signal causes the peaking amplifier to start delivering power to the RF output port 119. Under these conditions, the ($\lambda/4$) 50 ohm transmission line 117 also insures that the outputs of both the carrier and peaking amplifiers add in phase at the RF output port 119, so as to provide the maximum available output power and efficiency. A filter may also be inserted between the detector 109 and the bias control circuits 111 and 113 in order to remove any AC component or short term envelope fluctuations from the detector 109 output that may degrade intermodulation distortion.

If the carrier amplifier 105 and peaking amplifier 107 operated in the ideal manner described above, the bias levels could remain fixed at the levels established at zero detector output, i.e., there would be no need for any bias control circuitry. This situation is seldom, however, true in practice.

For example, the peaking amplifier 107 may have inadequate gain if it is biased so as to remain inactive until the RF input signal reaches half of its maximum permitted amplitude. In this case, it is advantageous to increase the bias on the peaking amplifier 107 when the RF input signal exceeds half of its maximum permitted amplitude. In addition, it may be advantageous to reduce the bias on the carrier amplifier 105 at some other RF input signal level, in order to maintain a constant gain in the Doherty type power amplifier over a wide range of input signal levels. This process improves the linearity of the Doherty-type power amplifier, thus reducing the level of intermodulation distortion at the RF output port 119.

The detector 109 may be connected elsewhere in the circuit, so as to monitor a different operating condition, such as the carrier amplifier 105 and/or peaking amplifier 107 RF output(s) or DC input current(s). The final choice of detector 109 location and function may be made to optimize the overall characteristics of the Doherty amplifier (e.g., efficiency, gain, gain flatness, intermodulation distortion, and so forth). An alternative embodiment is shown in FIG. 2.

Figure 2:
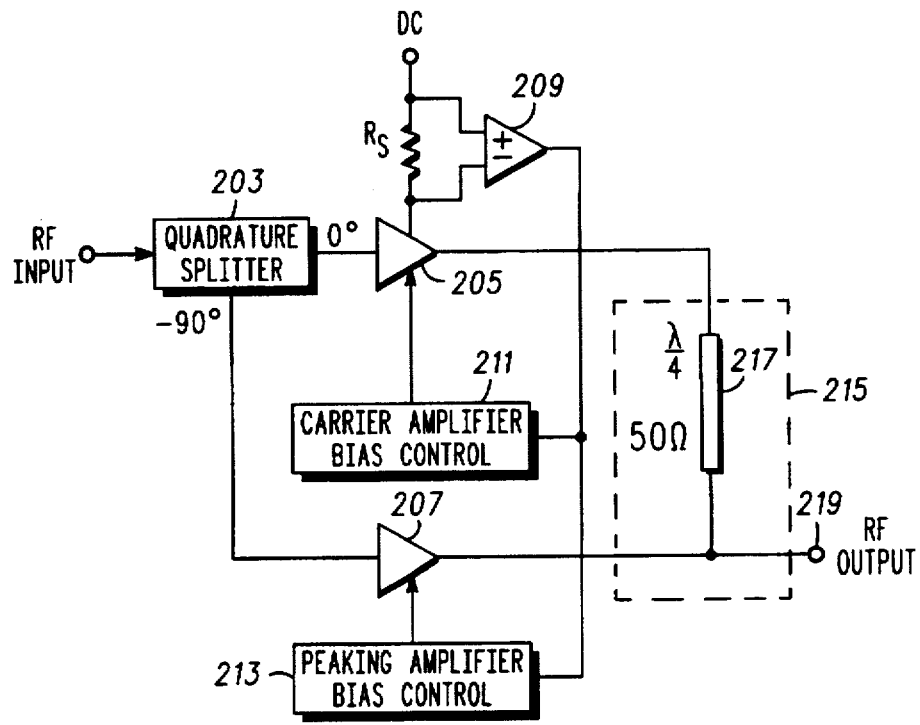
FIG. 2 is a block diagram of an alternate use of a Doherty-type power amplifier with bias control in accordance with the invention.

An alternate embodiment of a Doherty-type power amplifier with bias control is shown in FIG. 2. An RF input signal is fed into a quadrature splitter 203. The in-phase (0°) output of the quadrature splitter 203 is input to a carrier amplifier 205. The quadrature phase (minus 90°) output of the quadrature splitter 203 is input to a peaking amplifier 207. A differential amplifier 209 is placed across a resistor $R_r$, which is in series with the DC power input to the carrier amplifier 205. The voltage across this resistor is proportional to the DC current drawn by the carrier amplifier 205, which current is, in turn, proportional to the RF input power level of the RF input signal. The output of the differential amplifier 209 is an amplified replica of the voltage across resistor $R_r$. The output of the carrier amplifier bias control circuit 211 is input to the carrier amplifier 205 bias control. The output of the peaking amplifier bias control circuit 213 is input to the peaking amplifier 207 bias control input. The output of the carrier amplifier 205 and the peaking amplifier are combined in combiner 215, which includes a quarter wave length ($\lambda/4$) 50 ohm transmission line 217, yielding an output at node 219, similar to the function of the combiner 115 as described with respect to FIG. 1.

Figure 3:
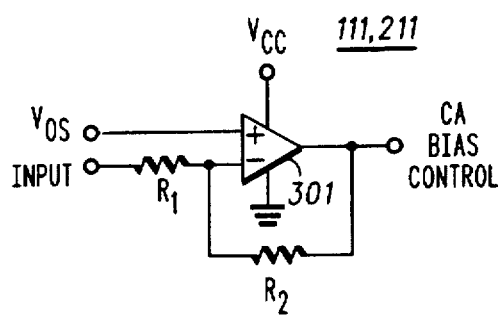
FIG. 3 is a block diagram of a bias control circuit for a carrier amplifier in accordance with the invention.

A block diagram of a bias control circuit for a carrier amplifier is shown in FIG. 3. The carrier amplifier bias control circuit 111 or 211 outputs a CA bias control signal that is input to the carrier amplifier 105 or 205. An operational amplifier 301 with its power supply input coupled to Vcc has its positive input coupled to reference voltage Vos. Vos is the offset voltage reference. The negative input of the operational amplifier 301 has a resistor $R_1$ in series with the input to the bias control circuit. In the case of FIG. 1, the bias control circuit input signal is the detector 109 output signal. In the case of FIG. 2, the bias control circuit input signal is the output of the differential amplifier 209. A resistor $R_2$ is coupled in series between the negative input of the operational amplifier 301 and the output of the operational amplifier 301.

Figure 4:
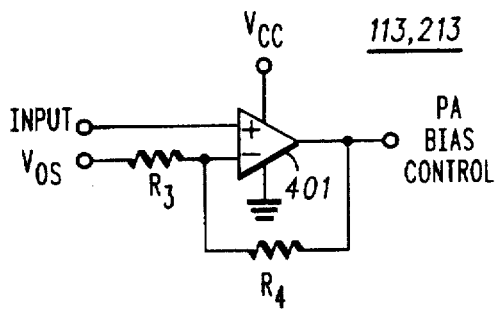
FIG. 4 is a block diagram of a bias control circuit for a peaking amplifier in accordance with the invention.

A block diagram of a bias control circuit for a peaking amplifier is shown in FIG. 4. The peaking amplifier bias control circuit 113 or 213 outputs a PA bias control signal that is input to the peaking amplifier 107 or 207. An operational amplifier 401 with its power supply input coupled to Vcc has its positive input coupled to the input signal to the bias control circuit 113 or 213. In the case of FIG. 1, the bias control circuit input signal is the detector 109 output signal. In the case of FIG. 2, the bias control circuit input signal is the output of the differential amplifier 209. A series resistor $R_3$ is placed between reference voltage Vos and the negative input of the differential amplifier. Another series resistor R4 is coupled in series between the negative input of the operational amplifier 401 and the output of the operational amplifier 401.

The bias control circuits 111, 113, 211, and 213 as shown are designed to handle a positive voltage as their input signal. The bias control circuits 111, 113, 211, and 213 may be easily modified by one of skill in the art to handle negative input signals.

Figure 5A:
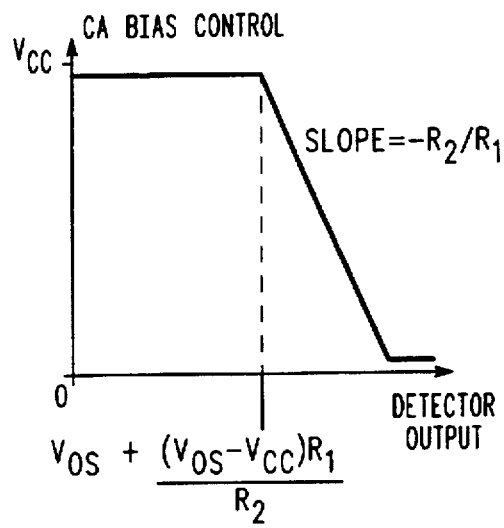
FIGS. 5A and FIG. 5B are graphical representations of bias control signals in accordance with the invention.

A graph of the CA bias control signal with respect to the detector output is shown in FIG. 5A. The CA bias control signal tracks in the opposite direction as the detector 109 or 209 output. The CA bias control signal remains near Vcc until the detector 109 or 209 output (Vdet) reaches a level of substantially Vos+(Vos−Vcc)$R_1/R_2$. The CA bias control signal then falls at a slope determined by the ratio $-R_2/R_1$ until it reaches a level near zero.

For example, assume that the CA bias control signal needs to vary from 5 V to 0 V as the detector 109 or 209 output goes from 4 V to 5 V, which is a slope of −5. The first step is to set Vcc=5 V in order to get the desired range of variation in the CA bias control signal. Next, the ratio $R_2/R_1$ must be equal to 5 in order to get the desired slope, which is accomplished by setting $R_1$=1000 ohms and $R_2$=5000 ohms. Finally, solving the above equation for Vos with Vdet=4V and Vcc=5V gives the required value of Vos, which is approximately 4.17 V.

It should be noted that the carrier amplifier bias control circuit of FIG. 3 may also be used for differential amplifier 209. In this case, the reference voltage Vos is connected to the end of Rs nearest the supply voltage DC and the terminal labeled INPUT is connected to the opposite end of Rs. The overall current to voltage transfer function is $RsR_2/R_1$.

Figure 5B:
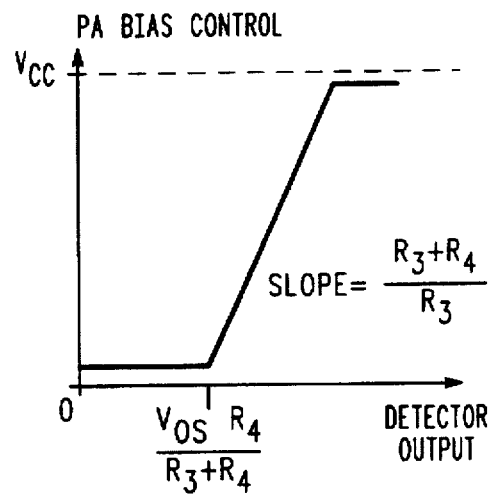

A graph of the PA bias control signal with respect to the detector output is shown in FIG. 5B. The PA bias control signal tracks in the same direction as the detector 109 or 209 output. The PA bias control signal remains near zero until the detector 109 or 209 output (Vdet) reaches a level of substantially (Vos)$R_4/(R_3+R_4)$. The PA bias control signal then rises at a slope determined by the ratio $(R_3+R_4)/R_3$ until it reaches a level near Vcc.

For example, assume that the PA bias control signal needs to vary from 0 V to 5 V as the detector 109 or 209 output goes from 2.5 V to 5 V, which is a slope of 2. The first step is to set Vcc=5 V in order to get the desired range of variation in the PA bias control signal. Next, the ratio $(R_3+R_4)/R_3$ must be equal to 2 in order to get the desired slope, which is accomplished by setting $R_3$=1000 ohms and $R_4$=1000 ohms. Finally, solving the above equation for Vos with Vdet=2.5 V and Vcc=5 V gives the required value of Vos, which is 5 V.

Figure 6:
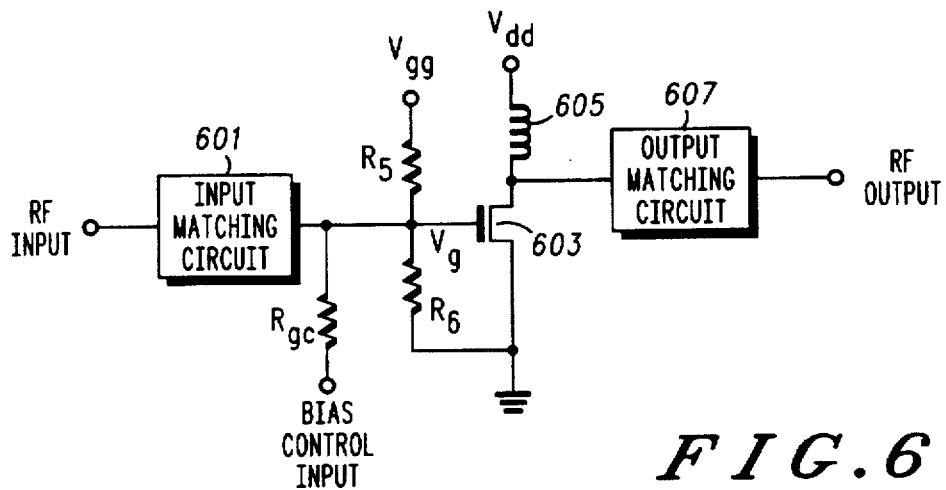
FIG. 6 is a block diagram of a carrier amplifier or a peaking amplifier in accordance with the invention.

A block diagram of a carrier amplifier 105 or 205 or a peaking amplifier 107 or 207 is shown in FIG. 6. The input to the amplifier of FIG. 6 is connected to an input matching circuit 601. The output of the input matching circuit is connected to the gate of a RF power amplifying device 603. The power amplifying device 603 may be a MOSFET power amplifying device, for example VMOS or LDMOS. The function of the input matching circuit 601 is to transform the RF impedance at the gate of the MOSFET device 603, which is typically around 1 ohm, to the level required for optimum functioning of the RF input source, which is typically 50 ohms. The input matching circuit may be constructed by using various combinations of reactive components, transformers, and transmission lines, as described in the book *Solid State Radio Engineering* by Herbert L. Krauss et al., (John Wiley & Sons, New York, 1980). The gate of the transistor 603 is connected to voltage supply Vgg through resistor $R_5$. The gate of transistor 603 is also connected to ground through resistor $R_6$. The source of transistor 603 is connected to ground. The drain of transistor 603 is connected to supply voltage Vdd via RF choke 605. The bias control input is connected to the gate of the transistor 603 via resistor Rgc. Rgc is chosen to give the desired variation in gate bias voltage Vg as the detector output goes from minimum to maximum. This variation in Vg is substantially Vcc*1000/(1000+Rgc), assuming that R5=R6=2000 ohms.

Vgg is then set, with the appropriate bias control circuit 111, 113, 211, or 213 connected, to give the desired Vg at minimum detector 109 or 209 output. The drain of transistor 603 is connected to an output matching circuit 607, which transforms the impedance at the drain of the MOSFET device 603, which is typically around 1 ohm, to the impedance at the RF output port 119, which is typically 50 ohms. The output matching circuit may be constructed by using various combinations of reactive components, transformers, and transmission lines, as described in the book *Solid State Radio Engineering* by Herbert L. Krauss et al., (John Wiley & Sons, New York, 1980). The output matching circuit outputs the RF output of the amplifier.

The present invention provides bias control of Doherty power amplifiers having zero bias current. The biasing scheme described above provides improved efficiency compared to prior art Doherty amplifiers using MOSFET devices by keeping the peaking amplifier in hard cutoff until the carrier amplifier has reached its saturation point. This biasing scheme also maintains a more constant power gain as a function of power level in the Doherty power amplifier because the bias to the carrier amplifier is decreased as the bias to the peaking amplifier is increased. This reduction in gain variation leads to reduced intermodulation distortion (improved linearity) in the Doherty power amplifier.

What is claimed is:

1. A power amplifier comprising:
   a power divider coupled to an RF input signal for producing an in-phase signal and a quadrature phase signal from the RF input signal;
   a carrier amplifier for amplifying the in-phase signal from the power divider, wherein the carrier amplifier has a carrier amplifier bias input;
   a peaking amplifier for amplifying the quadrature phase signal from the power divider, wherein the peaking amplifier has a peaking amplifier bias input;
   a combiner coupled to an output of the carrier amplifier and an output of the peaking amplifier, the combiner for combining in additive phase the output of the carrier amplifier and the output of the peaking amplifier;
   a first bias circuit coupled to the carrier amplifier, wherein the carrier amplifier bias input is provided by the first bias circuit and controlled by a first signal indicative of the magnitude of the RF input signal of the power amplifier; and
   a second bias circuit coupled to the peaking amplifier, wherein the peaking amplifier bias input is provided by the second bias circuit and controlled by a second signal indicative of the magnitude of the RF input signal of the power amplifier,
   a level of the carrier amplifier bias input decreased as a level of the peaking amplifier bias input is increased.

2. The power amplifier of claim 1, wherein the first signal and the second signal are the same signal.

3. The power amplifier of claim 1, wherein the first signal is derived from an output of an envelope detector that is coupled to the RF input signal.

4. The power amplifier of claim 1, wherein the second signal is derived from an output of an envelope detector that is coupled to the RF input signal.

5. The power amplifier of claim 1, wherein the carrier amplifier draws a current, and the first signal is proportional to the current.

6. The power amplifier of claim 1, wherein the carrier amplifier draws a current, and the second signal is proportional to the current.

7. A method for amplifying an RF input signal using a power amplifier comprising the steps of:

dividing the RF input signal into an in-phase signal and a quadrature phase signal;

varying a carrier amplifier bias input signal and a peaking amplifier bias input signal relative to a magnitude of the RF input signal, the carrier amplifier bias input signal decreasing as the peakinc amplifier bias input signal increases;

amplifying the in-phase signal using a carrier amplifier to produce a first amplified signal;

amplifying the quadrature phase signal using a peaking amplifier to produce a second amplified signal; and combining, in phase, the first amplified signal with the second amplified signal to produce an output signal.

8. The method of claim 7, further comprising the step of envelope detecting the RF input signal to derive the magnitude of the RF input signal.

9. The method of claim 7, further comprising the step of determining the magnitude of the RF input signal from a current drawn by the carrier amplifier.

* * * * *